United States Patent [19]

Anderson et al.

[11] 4,240,033

[45] Dec. 16, 1980

[54] METHOD AND APPARATUS FOR PREVENTING IONIZATION INDUCED NOISE IN DECOUPLER EXPERIMENTS

[75] Inventors: Marvin H. Anderson, Mountain View; George Chmyz, Palo Alto; Carl D. Daus, Santa Clara; George D. Kneip, Jr., Menlo Park, all of Calif.

[73] Assignee: Varian Associates, Inc., Palo Alto, Calif.

[21] Appl. No.: 23,939

[22] Filed: Mar. 26, 1979

[51] Int. Cl.³ .............................................. G01N 27/00
[52] U.S. Cl. ..................................... 324/321; 324/315
[58] Field of Search ................................ 324/315, 321

[56] References Cited

U.S. PATENT DOCUMENTS

| | | | |
|---|---|---|---|
| 2,864,995 | 12/1958 | Shoolery | 324/321 |
| 3,525,928 | 8/1970 | Nagao et al. | 324/315 |
| 3,551,792 | 12/1970 | Galland et al. | 324/321 |
| 3,775,670 | 11/1973 | Bozanio | 324/315 |
| 3,987,361 | 10/1976 | Martin | 324/315 |

*Primary Examiner*—Michael J. Tokar
*Attorney, Agent, or Firm*—Stanley Z. Cole; Gerald M. Fisher

[57] ABSTRACT

Apparatus and method for reduction of noise in NMR signals during high power heteronuclear decoupling experiments. A material is introduced into the evacuated area of the variable temperature probe to decrease collisional probability of ions generated in the interwall space of the evacuated envelop.

5 Claims, 3 Drawing Figures

METHOD AND APPARATUS FOR PREVENTING IONIZATION INDUCED NOISE IN DECOUPLER EXPERIMENTS

PRIOR ART

Quartz dewars have been used in NMR spectrometer probes to thermally isolate portions of the instrument.

Vacuum insulated containers or dewars to reduce heat conduction are well-known, i.e., between the atmosphere and liquid cryogens. Metallation of the inner walls of the vacuum space is also well-known to reduce radiant heat transfer. Multiple metallized reflecting shields supported by low conductivity fibrous spacer material have been used to wrap cryogenic tanks to further reduce radiant energy transfer. Mylar supported by small diameter glass fiber material has been successfully used as the spacer material for such wrapping because it exhibits low solid phase conductivity due to the small diameter of the fibers, while exhibiting low bulk conductivity. Powder materials added to the dewar interwall space prior to evacuation to reduce conductivity are known for long term storage of cryogens.

In NMR spectrometers, it is known to use a double walled evacuated envelop to isolate samples from heat generated by the RF decoupler coil and to isolate the probe electronics from the sample and from the temperature controlled flow gas used during variable temperature experiments. Due to the placement of these evacuated envelopes between the decoupler coil and the sample, the envelop must be essentially transparent to the electrical field generated by the decoupler coil. Quartz dewars are known to exhibit this electrical property while having low thermal conductivity.

Helium is frequently used as a coolant for superconducting magnets and as a flow gas for cross-polarization and low temperature NMR experiments. Helium is a highly mobile gas and readily diffuses through quartz. It has been recently recognized by NMR researchers that helium gas which has diffused into the quartz portions of NMR probes was instrumental in causing noise on the NMR spectra.

PRESENT INVENTION

The object of the present invention is to provide improved NMR spectra by eliminating noise resulting from ion collisions in the evacuated area of the probe vacuum envelop during high decoupler RF power experiments. A further object is to provide a new method of using fiber materials for packing in the evacuated space of an NMR vacuum envelop for restricting ion movement within the evacuated space. A feature of the improved NMR vacuum envelop is the insertion of an absorption material into the evacuated area of the envelop. This insert is made from materials highly transmissive to the RF electrical fields, and which exhibits a low thermal conductivity, do not outgas excessively, maintains structural integrity upon evacuation and have a susceptibility which does not degrade the homogeneity of the magnetic field. Certain ceramics and glass fibers are substances which have these properties.

In another feature of this invention, a low density borosilicate glass fiber sheet is wrapped around the inner vacuum envelop walls and between the envelop surfaces prior to evacuation.

BACKGROUND OF THE INVENTION

A decoupler coil located outside of the probe evacuated envelop radiates RF power through the envelop to selectively induce collapse of spin-spin interactions between nuclei located in the sample tube. This high RF power can be sufficient to excite and ionize gas molecules such as helium which may be present in the evacuated area between the walls of the envelop.

Ions so generated in the evacuated envelop of an NMR probe by the decoupler RF power are aligned and accelerated by the strong magnetic field present. Such acceleration substantially increases the collisional probability of these ions. When ions collide, the collision frequently results in emission of energy which can be manifested as noise at the receiver coil of the probe.

In non-solenoidal magnet NMR spectrometer systems, the electrical noise created by the flow of ions in the evacuated area of the evacuated probe envelop is not normally noise inducing due to the alignment of the d.c. magnetic field, $H_o$, perpendicular to the sample tube. Additionally, with non-solenoidal magnet systems, a relatively low RF power is employed for decoupling. In these configurations where the allignment of the d.c. magnetic field to perpendicular to the axis of the evacuated envelop, ions generated in the evacuated space will be accelerated only within the interwall area of the envelop perpendicular to the pole faces, resulting in relatively few collisions.

In the superconducting magnet configuration, the alignment of the d.c. magnetic field is parallel to the sample tube and high decoupler RF power (3 to 25 watts) is frequently employed. In these configurations, since $H_o$ is parallel to the axis of the evacuated envelop, ions formed in the evacuated area can accelerate the length of the interwall space, substantially increasing the collisional probability of ions present.

DESCRIPTION OF THE PREFERRED EMBODIMENTS

Figure 1:
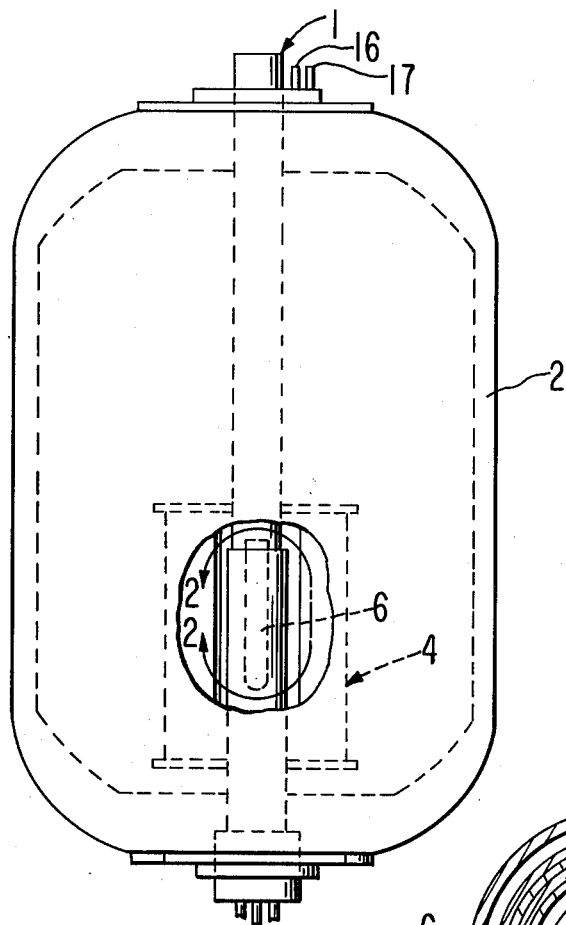
FIG. 1 is schematic illustration of a superconducting NMR spectrometer magnet and probe.

FIG. 1 depicts an NMR probe 1 inserted into a superconducting magnet 2. The probe 1 provides support for the sample tube 6, and the spinner assembly 14 for spinning the sample tube in the magnetic field. The probe assembly 1 receives the pneumatics at inlet 16 and 17 for controlling the spinner and the sample ejection. Power to excite the spin resonance is supplied to the probe and thence to the transmitter coil (not shown) in the vicinity of the sample. Decoupler power is also supplied to the probe assembly 1 which routes the power to the decoupler coil 7, shown in the cutaway 2—2, and shown in more detail in FIG. 2.

Figure 2:
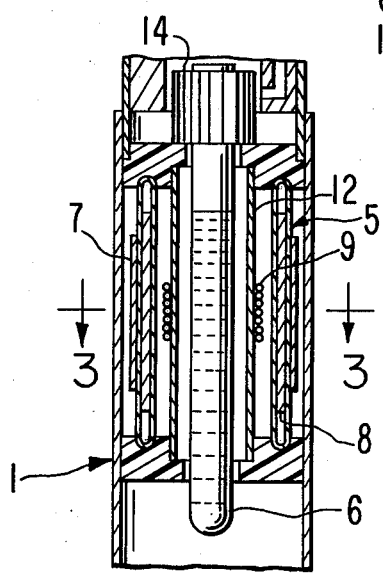
FIG. 2 is a cutaway of FIG. 1 showing the relationship between probe components in the sample zone.

FIG. 2 is a cutaway of FIG. 1 in the vicinity of the sample zone of a typical superconducting NMR probe such as is used in Varian Model XL-200. Sample tube 6 extends along the axis of a superconducting magnet 4. A receiver coil 9 is mounted to the outside of insert 12. A cylindrical quartz or pyrex double walled evacuated envelop 5 surrounds insert 12 and is slightly displaced therefrom. Decoupler coil 7 is mounted to the outside of envelop 5 and is used to irradiate the sample containing area within sample tube 6 to collapse spin-spin interactions between nuclei of sample located in the vicinity of receiver coil 9.

Figure 3:
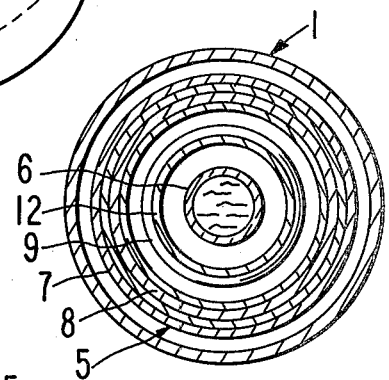
FIG. 3 illustrates a top view taken through 3—3 of FIG. 2.

Glass fiber material 8, such as Tissuglas (manufactured by Palflex, Inc.) or Dexiglas (manufactured by C. H. Dexter & Sons Paper Company), is shown wrapped between the walls of envelop 5 so as to substantially fill the cross section of the evacuated area between the walls. With reference to FIG. 3, the material 8 is readily seen in the space between the walls of the envelope 5. The addition of this material decreases the probability of ion collisions and the velocity of such collisions. With increased velocity, when certain ions collide, i.e., He, they emit energy which is observable both as noise at the receiver coil 9 and optical radiation as in the visible spectrum. The power level of the decoupling RF can be adjusted so that no visual glow is seen which procedure also decreases the noise in the NMR spectra. Any material 5 having the properties of low thermal conductivity, as of approximately 0.002 cal/cm-/sec/°C., susceptibility on the order of $-30 \times 10^{-6}$ cgs units, which does not affect the homogeneity of the magnetic field, RF field transmission parameters as of $\log_{10}$ volume resistivity =6 to 12, and Power Factor 0.0002 to 0.001, and which also exhibits structural integrity under vacuum should perform the task of decreasing collisional probability without otherwise deteriorating the NMR spectra.

Experiments with the packed evacuated envelop in place have been performed and have reduced significantly the electrical noise problems during decoupling experiments without any reduction in spectral quality.

What is claimed is:

1. In an NMR spectrometer, comprising a superconducting magnet having a axial bore therethrough, a probe structure for containing, in operation, a sample to be investigated in the magnetic field of said superconducting magnet, an RF decoupler coil, said RF decoupler coil located adjacent the sample area within said probe, a double walled vacuum envelop assembly, said assembly having the space between said walls substantially evacuated, said assembly being located, in operation, between said RF decoupler coil and said sample zone of said probe, said space between said walls of said assembly including a material substantially filling said space for decreasing the collisional probability of excited ions in the space between the walls of said envelop.

2. The apparatus of claim 1 wherein said material is a borosilicate glass fiber.

3. The apparatus of claim 2 wherein the fiber material is formed into a sheet.

4. The apparatus of claim 1 wherein the said material is a porous ceramic.

5. In an NMR spectrometer, the method of decreasing noise in spectra produced during decoupling experiments in instruments employing a double walled envelop containing a low pressure space between said walls, said double walled envelop being positioned between the sample zone and the RF decoupler coil, comprising, decreasing the probability of collision of helium ions in the said envelop by placing an energy absorbing material in said space and operating said RF field at a power level below the level which causes visible glow from ionization of materials within said space between the walls of said envelop.

* * * * *